United States Patent
Yi et al.

(10) Patent No.: US 10,032,425 B2
(45) Date of Patent: Jul. 24, 2018

(54) CMOS GOA CIRCUIT OF REDUCING CLOCK SIGNAL LOADING

(71) Applicant: Wuhan China Star Optoelectronics Technology Co., Ltd., Wuhan (CN)

(72) Inventors: Shijuan Yi, Wuhan (CN); Mang Zhao, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 197 days.

(21) Appl. No.: 15/119,385

(22) PCT Filed: May 25, 2016

(86) PCT No.: PCT/CN2016/083384
§ 371 (c)(1),
(2) Date: Aug. 16, 2016

(87) PCT Pub. No.: WO2017/181481
PCT Pub. Date: Oct. 26, 2017

(65) Prior Publication Data
US 2018/0151139 A1    May 31, 2018

(30) Foreign Application Priority Data
Apr. 21, 2016 (CN) .......................... 2016 1 0252411

(51) Int. Cl.
*G06F 3/038* (2013.01)
*G09G 5/00* (2006.01)
*G09G 3/36* (2006.01)

(52) U.S. Cl.
CPC ... *G09G 3/3677* (2013.01); *G09G 2310/0286* (2013.01); *G09G 2310/0291* (2013.01);
(Continued)

(58) Field of Classification Search
CPC ......... G09G 3/3677; G09G 2310/0291; G09G 2310/062; G09G 2310/0286; G09G 2320/0223; G09G 2330/021
See application file for complete search history.

(56) References Cited

U.S. PATENT DOCUMENTS

| | | | | |
|---|---|---|---|---|
| 2009/0033642 A1* | 2/2009 | Chiang | ................. | G11C 19/00 345/204 |
| 2015/0187323 A1* | 7/2015 | Jin | ....................... | G09G 5/003 345/215 |

(Continued)

FOREIGN PATENT DOCUMENTS

| | | | |
|---|---|---|---|
| CN | 104966501 A | * | 10/2015 |
| CN | CN105118466 A | | 12/2015 |

(Continued)

*Primary Examiner* — Srilakshmi K Kumar
*Assistant Examiner* — Brent D Castiaux
(74) *Attorney, Agent, or Firm* — Leong C. Lei (57) ABSTRACT

The CMOS GOA circuit of reducing clock signal loading comprises the input control module (1), the latch module (2), the reset module (3), the signal process module (4) and the output buffer module (5); in the input control module (1), the clock signal (CK(M)) merely needs to control the second N type thin film transistor and the fifth N type thin film transistor (T2, T5), and the amount of the thin film transistors driven by the clock signal can be decreased to reduce the clock signal loading, and to lower the RC delay and the power consumption of the clock signal; the latch module (2) utilizes the inverted scan drive signal (XGate(N−2)) of the two former N-2th stage GOA unit to be the input control signal of the stage transfer signal Q(N) to solve the competition problem occurs as the stage transfer signal (Q(N)) is inputted.

18 Claims, 7 Drawing Sheets

(52) U.S. Cl.
CPC ......... *G09G 2310/062* (2013.01); *G09G 2320/0223* (2013.01); *G09G 2330/021* (2013.01)

(56) References Cited

U.S. PATENT DOCUMENTS

2015/0379919 A1* 12/2015 Wen ................ G09G 3/003
                                                    345/215
2017/0193942 A1*  7/2017 Li ................. G09G 3/3677

FOREIGN PATENT DOCUMENTS

| CN | CN105321492 A | 2/2016 |
| CN | CN105469761 A | 4/2016 |

* cited by examiner

CMOS GOA CIRCUIT OF REDUCING CLOCK SIGNAL LOADING

FIELD OF THE INVENTION

The present invention relates to a display technology field, and more particularly to a CMOS GOA circuit of reducing clock signal loading.

BACKGROUND OF THE INVENTION

The GOA (Gate Driver on Array) technology, i.e. the array substrate row driving technology is to utilize the array manufacture process of the Thin Film Transistor (TFT) liquid crystal display to manufacture the gate driving circuit on the Thin Film Transistor array substrate for realizing the driving way of scanning the gates row by row. It possesses advantages of reducing the production cost and realizing the panel narrow frame design, and is utilized by many kinds of displays.

The GOA circuit has two basic functions: the first is to output the scan driving circuit for driving the gate lines in the panel to activate the TFTs in the display areas and to charge the pixels; the second is the shift register function. When the output of one scan driving signal is accomplished, the output of the next scan driving signal is performed with the control of the clock signal, and the transfer carries on in sequence.

With the development of Low Temperature Poly-Silicon (LTPS) semiconductor thin film transistor, the LTPS TFT liquid crystal display gradually becomes the focus that people pay lots of attentions. Because the silicon crystallization of the LTPS has better order than the amorphous silicon, and the LTPS semiconductor has ultra high carrier mobility, the liquid crystal display utilizing the LTPS TFT possesses advantages of high resolution, fast response speed, high brightness, high aperture ratio and et cetera. Correspondingly, the peripheral circuit around the LTPS TFT liquid crystal panel also becomes the focus that people pay lots of attentions.

Figure 1:
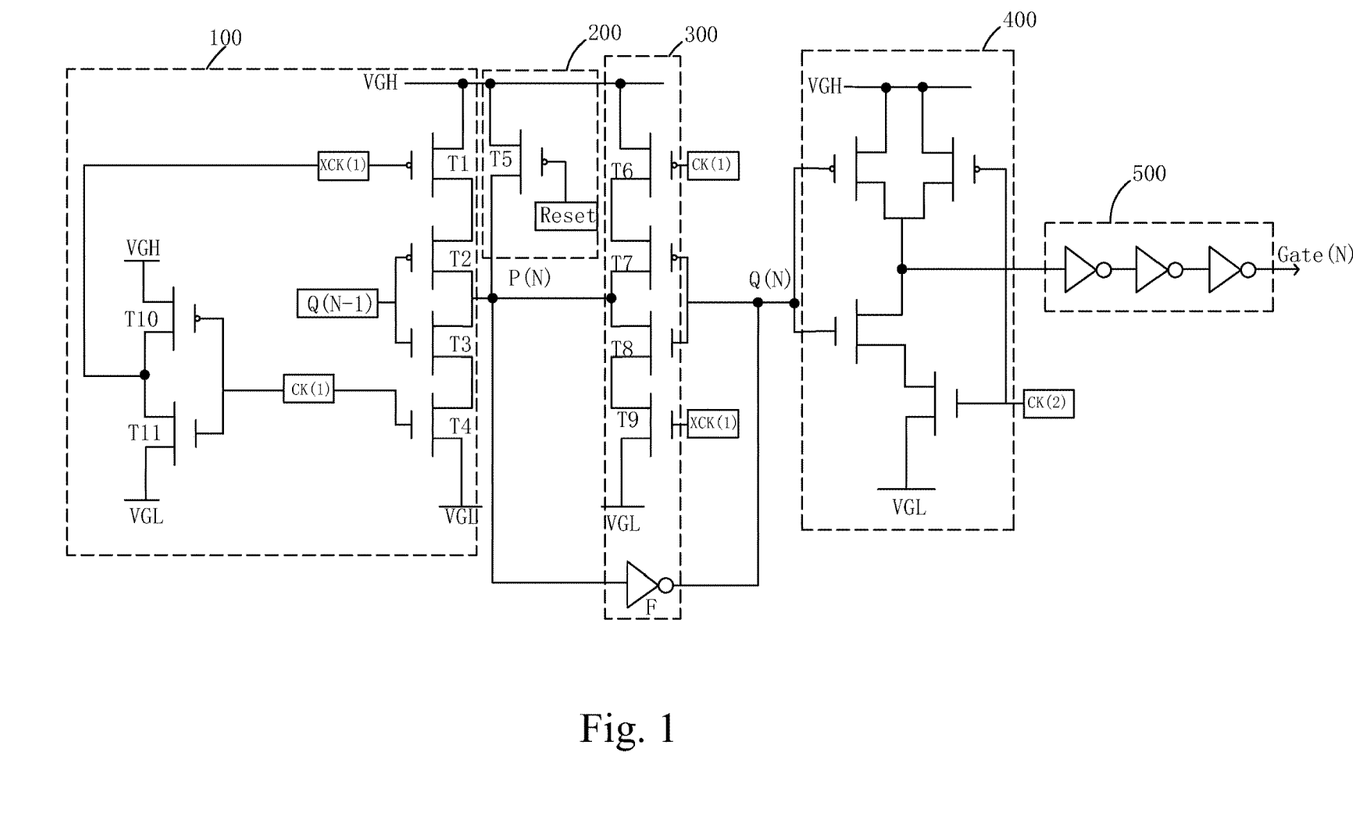
FIG. 1 is a circuit diagram of a CMOS GOA circuit according to prior art.

FIG. 1 shows a CMOS GOA circuit according to prior art, comprising a plurality of GOA units which are cascade connected, wherein N is set to be a positive integer, and the nth GOA unit comprises: an input control module 100, a reset module 200, a latch module 300, a signal process module 400 and an output buffer module 500.

The input control module 100 receives a stage transfer signal Q(N−1) of the GOA unit circuit of the former stage, a first clock signal CK(1), a first inverted clock signal XCK(1), a constant high voltage level signal VGH and a constant low voltage level signal VGL, and is employed to input the signal P(N) which the voltage level is opposite to the stage transfer signal Q(N−1) of the GOA unit circuit of the former stage into the latch module 300. In the input control module 100, beside the fourth N type thin film transistor T4, the first clock signal CK(1) also controls an inverter constructed by the tenth P type thin film transistor T10 and the eleventh N type thin film transistor T11 to obtain the first inverted clock signal XCK(1).

The latch module 300 comprises an inverter F to invert the signal P(N) and obtains the stage transfer signal of the GOA unit circuit of the Nth stage, and the latch module 300 performs latch to the stage transfer signal Q(N). In the latch module 300, the first clock signal CK(1) needs to control the sixth P type thin film transistor T6.

The reset module 200 is employed to perform clear zero process to the stage transfer signal Q(N) of the GOA unit circuit of the Nth stage.

The signal process module 400 receives the latched stage transfer signal Q(N), the second clock signal CK(2), the constant high voltage level signal VGH and the constant low voltage level signal VGL, and is employed to implement NAND logic process to the second clock signal CK(2) and the stage transfer signal Q(N) to generate a scan driving signal G(N) of the GOA unit circuit of the Nth stage.

The output buffer module 500 is electrically couple to the signal process module 400 and employed to increase a driving ability of the scan driving signal Gate(N), and the working procedure of reducing the RC loading in the signal transmission process in the present CMOS GOA circuit is below:

As the high voltage level pulse of the stage transfer signal Q(N−1) of the former stage arrives, the first clock signal CK(1) is high voltage level, and then the first P type thin film transistor T1, the third N type thin film transistor T3 and the fourth N type thin film transistor T4 are activated, and the Q(N) node is charged to be high voltage level; as the function of the first clock signal CK(1) is finished, the first P type thin film transistor T1 and the fourth N type thin film transistor T4 are deactivated, and the sixth P type thin film transistor T6 and the ninth N type thin film transistor T9 are activated, and then, the stage transfer signal Q(N) is latched; as the high voltage level pulse of the second clock signal CK(2) arrives, the scan drive signal Gate(N) outputs high voltage level; as the function of the second clock signal CK(2) is finished, the scan drive signal Gate(N) is stabled at low voltage level.

As aforementioned, the present CMOS GOA circuit possesses excellent logic function but there is an inevitable problem, which is that the amount of the thin film transistors driven by the clock signal is more as the GOA circuit drives. For instance, as inputting the stage transfer signal, the clock signal needs to control four thin film transistors T4, T6, T10 and T11. Therefore, the clock signal needs to suffer a very large loading, which will lead to the RC delay and the power consumption increase of the clock signal.

SUMMARY OF THE INVENTION

An objective of the present invention is to provide a CMOS GOA circuit capable of decreasing the amount of the thin film transistors driven by the clock signal to reduce the clock signal loading, and to lower the RC delay and the power consumption of the clock signal.

For realizing the aforesaid objective, the present invention provides a CMOS GOA circuit of reducing clock signal loading, comprising: GOA units of a plurality of stages, wherein the GOA units of odd stages are cascade coupled, and the GOA units of even stages are cascade coupled;

N is set to be positive integer, and except the GOA units of the first, the second, the next to last and the last stages, in the Nth GOA unit comprises: an input control module, a latch module electrically coupled to the input control module, a reset module electrically coupled to the latch module, a signal process module electrically coupled to the latch module, an output buffer module electrically coupled to the signal process module;

the input control module receives a stage transfer signal and a Mth clock signal of the two former N−2th stage GOA unit, and is employed to invert the stage transfer signal of the two former N−2th stage GOA unit twice to obtain a stage transfer signal and input the stage transfer signal to the latch module;

the latch module receives an inverted scan drive signal of the two former N−2th stage GOA unit to be an input control signal of the stage transfer signal, and is employed to latch the stage transfer signal; meanwhile, the latch module further receives a scan drive signal of the two latter N+2th stage GOA unit or an inverted scan drive signal of the two latter N+2th stage GOA unit to be a pull down control signal of the stage transfer signal;

the reset module is employed to perform clear zero process to the stage transfer signal;

the signal process module is employed to implement NAND logic process to the M+2th clock signal and the stage transfer signal to generate a scan drive signal of the Nth stage GOA unit;

the output buffer module is employed to output the scan driving signal and to increase a driving ability of the scan driving signal.

The input control module comprises: a first P type thin film transistor, a second N type thin film transistor and a third N type thin film transistor, which are coupled in series, and a fourth P type thin film transistor, a fifth N type thin film transistor and a sixth N type thin film transistor, which are coupled in series; a gate of the first P type thin film transistor receives the stage transfer signal of the two former N−2th stage GOA unit, and a source receives the constant high voltage level signal, and a drain is electrically coupled to a source of the second N type thin film transistor; a gate of the second N type thin film transistor receives the Mth clock signal, and a drain is electrically coupled to a source of the third N type thin film transistor; a gate of the third N type thin film transistor receives the stage transfer signal of the two former N−2th stage GOA unit, and a drain receives the constant low voltage level signal; a gate of the fourth P type thin film transistor is electrically coupled to the drain of the first P type thin film transistor and the source of the second N type thin film transistor, and a source receives the constant high voltage level signal, and a drain is electrically coupled to a source of the fifth N type thin film transistor; a gate of the fifth N type thin film transistor receives the Mth clock signal, and a drain is electrically coupled to a source of the sixth N type thin film transistor; a gate of the sixth N type thin film transistor is electrically coupled to the drain of the drain of the first P type thin film transistor and the source of the second N type thin film transistor, and a drain receives the constant low voltage level signal; a drain of the P type fourth thin film transistor and a source of the fifth N type thin film transistor output the stage transfer signal.

As the latch module receives the scan drive signal of the two latter N+2th stage GOA unit to be the pull down control signal of the stage transfer signal, the latch module comprises: a seventh P type thin film transistor, an eighth N type thin film transistor, a ninth P type thin film transistor, a tenth P type thin film transistor, an eleventh N type thin film transistor and a twelfth N type thin film transistor; a gate of the seventh P type thin film transistor receives the stage transfer signal, and a source receives the constant high voltage level signal, and a drain is electrically coupled to a source of the eighth N type thin film transistor and the node; a gate of the eighth N type thin film transistor receives the stage transfer signal, and a drain receives the constant low voltage level signal; a gate of the ninth P type thin film transistor is electrically coupled to the node, and a source receives the constant high voltage level signal, and a drain is electrically coupled to a source of the tenth P type thin film transistor; a gate of the tenth P type thin film transistor receives the scan drive signal of the two latter N+2th stage GOA unit, and a drain is electrically coupled to a source of the eleventh N type thin film transistor and the stage transfer signal; a gate of the eleventh N type thin film transistor receives the inverted scan drive signal of the two former N−2th stage GOA unit, and a drain is electrically coupled to a source of the twelfth N type thin film transistor; a gate of the twelfth N type thin film transistor is electrically coupled to the node, and a drain receives the constant low voltage level signal.

As the latch module receives the scan drive signal of the two latter N+2th stage GOA unit to be the pull down control signal of the stage transfer signal, the latch module comprises: a seventh P type thin film transistor, an eighth N type thin film transistor, a ninth P type thin film transistor, a tenth P type thin film transistor, an eleventh N type thin film transistor and a twelfth N type thin film transistor; a gate of the seventh P type thin film transistor receives the stage transfer signal, and a source receives the constant high voltage level signal, and a drain is electrically coupled to a source of the tenth N type thin film transistor and the node; a gate of the tenth N type thin film transistor receives the inverted scan drive signal of the two latter N+2th stage GOA unit, and a drain is electrically coupled to a source of the eighth N type thin film transistor; a gate of the eighth N type thin film transistor receives the stage transfer signal, and a drain receives the constant low voltage level signal; a gate of the ninth P type thin film transistor is electrically coupled to the node, and a source receives the constant high voltage level signal, and a drain is electrically coupled to a source of the eleventh N type thin film transistor and the stage transfer signal; a gate of the eleventh N type thin film transistor receives the inverted scan drive signal of the two former N−2th stage GOA unit, and a drain is electrically coupled to a source of the twelfth N type thin film transistor; a gate of the twelfth N type thin film transistor is electrically coupled to the node, and a drain receives the constant low voltage level signal.

The reset module comprises a thirteenth thin film transistor, and a gate of the thirteenth thin film transistor receives a reset signal, and a source receives the constant high voltage level signal, and a drain is electrically coupled to the latch module through the node.

The signal process module comprises a NAND gate, and a first input end of the NAND gate receives the stage transfer signal, and a second input end receives the M+2 clock signal, and an output end is electrically coupled to the output buffer module.

The output buffer module comprises three inverters which are sequentially coupled in series, and an input end of the first inverter, which is closest to the signal process module, is electrically coupled to the output end of the NAND gate, and an output end of the third inverter, which is farthest to the signal process module, outputs the scan drive signal, and an output end of the second inverter outputs the Nth inverted scan drive signal.

The clock signal comprises four clock signals: a first clock signal, a second clock signal, a third clock signal and a fourth clock signal; as the Mth clock signal is the third clock signal, the M+2th clock signal is the first clock signal; as the Mth clock signal is the fourth clock signal, the M+2th clock signal is the second clock signal;

the GOA units of odd stages which are cascade coupled receive the first clock signal and the third clock signal, and the GOA units of even stages which are cascade coupled receive the second clock signal and the fourth clock signal.

The NAND gate comprises a fourteenth P type thin film transistor and a fifteenth P type thin film transistor, which are oppositely located, and a sixteenth N type thin film transistor and a seventeenth N type thin film transistor, which are coupled in series; a gate of the fourteenth P type thin film transistor and a gate of the sixteenth N type thin film transistor are electrically coupled to be the first input end of the NAND gate, and a gate of the fifteenth P type thin film transistor and a gate of the seventeenth N type thin film transistor are electrically coupled to be the second input end of the NAND gate, and both the drains of the fourteenth P type thin film transistor and the fifteenth P type thin film transistor are electrically coupled to a source of the sixteenth N type thin film transistor to be the output end of the NAND gate, and a drain of the sixteenth N type thin film transistor is electrically coupled to a source of the seventeenth N type thin film transistor, and a drain of the seventeenth N type thin film transistor receives the constant low voltage level signal.

Each inverter comprises an eighteen P type thin film transistor and a nineteenth N type thin film transistor; gates of the eighteen P type thin film transistor and the nineteenth N type thin film transistor are electrically coupled to each other to construct the input end of the inverter, and a source of the eighteen P type thin film transistor receives the constant high voltage level signal, and a drain of the nineteenth N type thin film transistor receives the constant low voltage level signal, and a drain of the eighteen P type thin film transistor and a source of the nineteenth N type thin film transistor are electrically coupled to each other to construct the output end of the inverter; the output end of the former inverter is electrically coupled to the input end of the latter inverter.

The present invention further provides a CMOS GOA circuit of reducing clock signal loading, comprising: GOA units of a plurality of stages, wherein the GOA units of odd stages are cascade coupled, and the GOA units of even stages are cascade coupled;

N is set to be positive integer, and except the GOA units of the first, the second, the next to last and the last stages, in the Nth GOA unit comprises: an input control module, a latch module electrically coupled to the input control module, a reset module electrically coupled to the latch module, a signal process module electrically coupled to the latch module, an output buffer module electrically coupled to the signal process module;

the input control module receives a stage transfer signal and a Mth clock signal of the two former N−2th stage GOA unit, and is employed to invert the stage transfer signal of the two former N−2th stage GOA unit twice to obtain a stage transfer signal and input the stage transfer signal to the latch module;

the latch module receives an inverted scan drive signal of the two former N−2th stage GOA unit to be an input control signal of the stage transfer signal, and is employed to latch the stage transfer signal; meanwhile, the latch module further receives a scan drive signal of the two latter N+2th stage GOA unit or an inverted scan drive signal of the two latter N+2th stage GOA unit to be a pull down control signal of the stage transfer signal;

the reset module is employed to perform clear zero process to the stage transfer signal;

the signal process module is employed to implement NAND logic process to the M+2th clock signal and the stage transfer signal to generate a scan drive signal of the Nth stage GOA unit;

the output buffer module is employed to output the scan driving signal and to increase a driving ability of the scan driving signal;

wherein the input control module comprises: a first P type thin film transistor, a second N type thin film transistor and a third N type thin film transistor, which are coupled in series, and a fourth P type thin film transistor, a fifth N type thin film transistor and a sixth N type thin film transistor, which are coupled in series; a gate of the first P type thin film transistor receives the stage transfer signal of the two former N−2th stage GOA unit, and a source receives the constant high voltage level signal, and a drain is electrically coupled to a source of the second N type thin film transistor; a gate of the second N type thin film transistor receives the Mth clock signal, and a drain is electrically coupled to a source of the third N type thin film transistor; a gate of the third N type thin film transistor receives the stage transfer signal of the two former N−2th stage GOA unit, and a drain receives the constant low voltage level signal; a gate of the fourth P type thin film transistor is electrically coupled to the drain of the first P type thin film transistor and the source of the second N type thin film transistor, and a source receives the constant high voltage level signal, and a drain is electrically coupled to a source of the fifth N type thin film transistor; a gate of the fifth N type thin film transistor receives the Mth clock signal, and a drain is electrically coupled to a source of the sixth N type thin film transistor; a gate of the sixth N type thin film transistor is electrically coupled to the drain of the drain of the first P type thin film transistor and the source of the second N type thin film transistor, and a drain receives the constant low voltage level signal; a drain of the P type fourth thin film transistor and a source of the fifth N type thin film transistor output the stage transfer signal;

wherein the reset module comprises a thirteenth thin film transistor, and a gate of the thirteenth thin film transistor receives a reset signal, and a source receives the constant high voltage level signal, and a drain is electrically coupled to the latch module through the node.

The benefits of the present invention are: the present invention provides the CMOS GOA circuit of reducing clock signal loading, which comprises the input control module, the latch module, the reset module, the signal process module and the output buffer module; in the input control module, the clock signal merely needs to control the second N type thin film transistor and the fifth N type thin film transistor. In comparison with the CMOS GOA circuit according to prior art, the amount of the thin film transistors driven by the clock signal can be decreased to reduce the clock signal loading, and to lower the RC delay and the power consumption of the clock signal; the latch module utilizes the inverted scan drive signal of the two former N−2th stage GOA unit to be the input control signal of the stage transfer signal to solve the competition problem occurs as the stage transfer signal is inputted, and utilizes the scan drive signal of the two latter N+2th stage GOA unit or the inverted scan drive signal of the two latter N+2th stage GOA unit to be the pull down control signal of the stage transfer signal to solve the competition problem occurs in the pull down procedure of the stage transfer signal.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

The present invention provides a CMOS GOA circuit of reducing clock signal loading.

Figure 2:
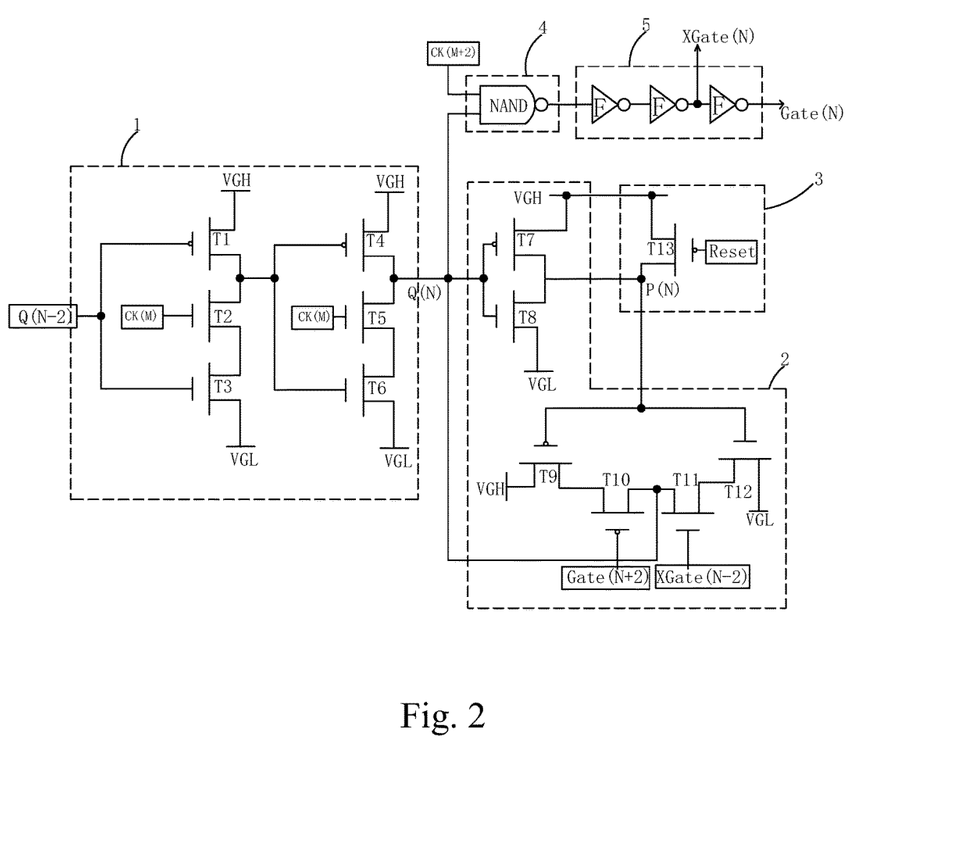
FIG. 2 is a circuit diagram of the first embodiment according to the CMOS GOA circuit of reducing clock signal loading of the present invention.

Please refer to FIG. 2. The first embodiment of the CMOS GOA circuit of reducing clock signal loading according to the present invention comprises: GOA units of a plurality of stages, wherein the GOA units of odd stages are cascade coupled, and the GOA units of even stages are cascade coupled. N is set to be positive integer, and except the GOA units of the first, the second, the next to last and the last stages, in the Nth GOA unit comprises: an input control module 1, a latch module 2 electrically coupled to the input control module 1, a reset module 3 electrically coupled to the latch module 2, a signal process module 4 electrically coupled to the latch module 2, an output buffer module 5 electrically coupled to the signal process module 4.

The input control module 1 receives a stage transfer signal Q(N−2) and a Mth clock signal CK(M) of the two former N−2th stage GOA unit, and is employed to invert the stage transfer signal Q(N−2) of the two former N−2th stage GOA unit twice to obtain a stage transfer signal Q(N) and input the stage transfer signal Q(N) to the latch module 2.

Specifically, the input control module 1 comprises: a first P type thin film transistor T1, a second N type thin film transistor T2 and a third N type thin film transistor T3, which are coupled in series, and a fourth P type thin film transistor T4, a fifth N type thin film transistor T5 and a sixth N type thin film transistor T6, which are coupled in series; a gate of the first P type thin film transistor T1 receives the stage transfer signal Q(N−2) of the two former N−2th stage GOA unit, and a source receives the constant high voltage level signal VGH, and a drain is electrically coupled to a source of the second N type thin film transistor T2; a gate of the second N type thin film transistor T2 receives the Mth clock signal CK(M), and a drain is electrically coupled to a source of the third N type thin film transistor T3; a gate of the third N type thin film transistor T3 receives the stage transfer signal Q(N−2) of the two former N−2th stage GOA unit, and a drain receives the constant low voltage level signal VGL; a gate of the fourth P type thin film transistor T4 is electrically coupled to the drain of the first P type thin film transistor T1 and the source of the second N type thin film transistor T2, and a source receives the constant high voltage level signal VGH, and a drain is electrically coupled to a source of the fifth N type thin film transistor T5; a gate of the fifth N type thin film transistor T5 receives the Mth clock signal CK(M), and a drain is electrically coupled to a source of the sixth N type thin film transistor T6; a gate of the sixth N type thin film transistor T6 is electrically coupled to the drain of the drain of the first P type thin film transistor T1 and the source of the second N type thin film transistor T2, and a drain receives the constant low voltage level signal VGL; a drain of the P type fourth thin film transistor T4 and a source of the fifth N type thin film transistor T5 output the stage transfer signal Q(N).

Furthermore, as the Mth clock signals CK(M) are all high voltage levels, the second N type thin film transistor T2 and the fifth N type thin film transistor T5 are activated, and once the stage transfer signal Q(N−2) of the N−2th GOA unit is high voltage level, the third N type thin film transistor T3 is activated, and the constant low voltage level signal VGL passes through the activated second N type thin film transistor T2 and the third N type thin film transistor T3, and implements the first inversion to the stage transfer signal Q(N−2) of the N−2th GOA unit, and then the fourth P type thin film transistor T4 is activated by control of the constant low voltage level signal VGL, the constant high voltage level signal VGH passes through the fourth P type thin film transistor T4, and implements the second inversion to the stage transfer signal Q(N−2) of the N−2th GOA unit to output the stage transfer signal Q(N) of high voltage level; once the inversion to the stage transfer signal Q(N−2) of the N−2th GOA unit is low voltage level, the first P type thin film transistor T1 is activated, and the constant high voltage level signal VGH passes through the activated first P type thin film transistor T1, and implements the first inversion to the stage transfer signal Q(N−2) of the N−2th GOA unit, and then the sixth N type thin film transistor T6 is activated by the control of the constant high voltage level signal VGH, and the constant low voltage level signal VGL passes through the activated fifth N type thin film transistor T5 and the sixth N type thin film transistor T6, and implements the second inversion to the stage transfer signal Q(N−2) of the N−2th GOA unit to output the stage transfer signal Q(N) of low voltage level.

In the first embodiment shown in FIG. 2, the latch module 2 is employed to latch the stage transfer signal Q(N), and receives an inverted scan drive signal XGate(N−2) of the two former N−2th stage GOA unit to be an input control signal of the stage transfer signal Q(N) to solve the competition problem occurs as the stage transfer signal Q(N) is inputted, and then, the scan drive signal Gate(N+2) of the two latter N+2th stage GOA unit is received to be the pull down control signal of the stage transfer signal Q(N) to solve the competition problem occurs in the pull down procedure of the stage transfer signal Q(N).

The specific structure of the latch module 2 comprises: a seventh P type thin film transistor T7, an eighth N type thin film transistor T8, a ninth P type thin film transistor T9, a tenth P type thin film transistor T10, an eleventh N type thin film transistor T11 and a twelfth N type thin film transistor T12; a gate of the seventh P type thin film transistor T7 receives the stage transfer signal Q(N), and a source receives the constant high voltage level signal VGH, and a drain is electrically coupled to a source of the eighth N type thin film transistor T8 and the node P(N); a gate of the eighth N type thin film transistor T8 receives the stage transfer signal Q(N), and a drain receives the constant low voltage level signal VGL; a gate of the ninth P type thin film transistor T9 is electrically coupled to the node P(N), and a source receives the constant high voltage level signal VGH, and a drain is electrically coupled to a source of the tenth P type thin film transistor T10; a gate of the tenth P type thin film transistor T10 receives the scan drive signal Gate(N+2) of the two latter N+2th stage GOA unit, and a drain is electrically coupled to a source of the eleventh N type thin film transistor T11 and the stage transfer signal Q(N); a gate of the eleventh N type thin film transistor T11 receives the inverted scan drive signal XGate(N−2) of the two former N−2th stage GOA unit, and a drain is electrically coupled to a source of the twelfth N type thin film transistor T12; a gate of the twelfth N type thin film transistor T12 is electrically coupled to the node P(N), and a drain receives the constant low voltage level signal VGL.

The reset module 3 comprises a thirteenth thin film transistor T13, and a gate of the thirteenth thin film transistor T13 receives a reset signal Reset, and a source receives the constant high voltage level signal VGH, and a drain is electrically coupled to the latch module 2 through the node P(N), and is employed to perform clear zero process to the stage transfer signal Q(N).

The signal process module 4 comprises a NAND gate NAND, and a first input end of the NAND gate NAND receives the stage transfer signal Q(N), and a second input end receives the M+2 clock signal CK(M+2), and an output end is electrically coupled to the output buffer module 5, and is employed to implement NAND logic process to the M+2th clock signal CK(M+2) and the stage transfer signal Q(N) to generate a scan drive signal Gate(N) of the Nth stage GOA unit.

Figure 4:
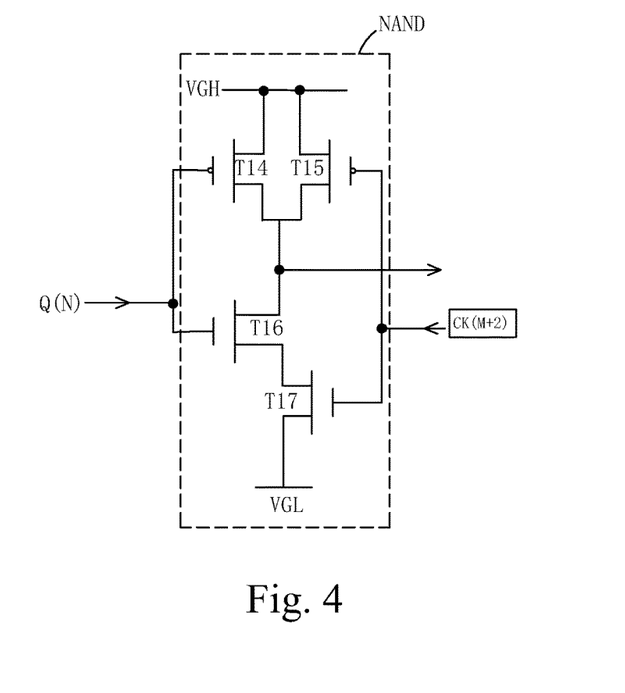
FIG. 4 is a specific circuit structure diagram of the NAND gate in the CMOS GOA circuit of reducing clock signal loading according to the present invention.

Specifically, as shown in FIG. 4, the NAND gate comprises a fourteenth P type thin film transistor T14 and a fifteenth P type thin film transistor T15, which are oppositely located, and a sixteenth N type thin film transistor T16 and a seventeenth N type thin film transistor T17, which are coupled in series; a gate of the fourteenth P type thin film transistor T14 and a gate of the sixteenth N type thin film transistor T16 are electrically coupled to be the first input end of the NAND gate NAND, and a gate of the fifteenth P type thin film transistor T15 and a gate of the seventeenth N type thin film transistor T17 are electrically coupled to be the second input end of the NAND gate NAND, and both the sources of the fourteenth P type thin film transistor T14 and the fifteenth P type thin film transistor T15 receive the constant high voltage level signal VGH, and both the drains of the fourteenth P type thin film transistor T14 and the fifteenth P type thin film transistor T15 are electrically coupled to a source of the sixteenth N type thin film transistor T16 to be the output end of the NAND gate NAND, and a drain of the sixteenth N type thin film transistor T16 is electrically coupled to a source of the seventeenth N type thin film transistor T17, and a drain of the seventeenth N type thin film transistor T17 receives the constant low voltage level signal VGL.

Furthermore, only as both the first input end and the second input end of the NAND gate NAND are inputted with high voltage level, i.e. both the stage transfer signal Q(N) and the M+2th clock signal CK(M+2) are high voltage level, the sixteenth N type thin film transistor T16 and the seventeenth N type thin film transistor T17 are activated at the same time, and the output end outputs low voltage level of the constant low voltage level signal VGL; at least one of the first input end and the second input end is inputted with low voltage level, i.e. in condition that at least one of the stage transfer signal Q(N) and the M+2th clock signal CK(M+2) is low voltage level, at least one of the fourteenth P type thin film transistor T14 and the fifteenth P type thin film transistor T15 are activated, and the output end outputs high voltage level of the constant high voltage level signal VGH.

The output buffer module 5 comprises an odd number of inverters F which are sequentially coupled in series, which are employed to output the scan driving signal G(N) and to increase a driving ability of the scan driving signal G(N).

Preferably, the output buffer module 5 comprises three inverters F which are sequentially coupled in series, and an input end of the first inverter F, which is closest to the signal process module 4, is electrically coupled to the output end of the NAND gate NAND, and an output end of the third inverter F, which is farthest to the signal process module 4, outputs the scan drive signal Gate(N), and an output end of the second inverter F in the middle outputs the Nth inverted scan drive signal XGate(N).

Figure 5:
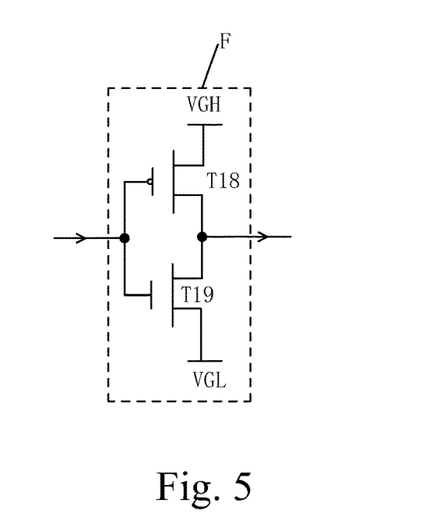
FIG. 5 is a specific circuit structure diagram of the inverter in the CMOS GOA circuit of reducing clock signal loading according to the present invention.

Specifically, as shown in FIG. 5, each inverter F comprises an eighteen P type thin film transistor T18 and a nineteenth N type thin film transistor T19; gates of the eighteen P type thin film transistor T18 and the nineteenth N type thin film transistor T19 are electrically coupled to each other to construct the input end of the inverter F, and a source of the eighteen P type thin film transistor T18 receives the constant high voltage level signal VGH, and a drain of the nineteenth N type thin film transistor T19 receives the constant low voltage level signal VGL, and a drain of the eighteen P type thin film transistor T18 and a source of the nineteenth N type thin film transistor T19 are electrically coupled to each other to construct the output end of the inverter F; the output end of the former inverter F is electrically coupled to the input end of the latter inverter F.

Furthermore, as the input end of the inverter T is inputted with high voltage level, the nineteenth N type thin film transistor T19 is activated, and the output end outputs low voltage level of the constant low voltage level signal VGL; as the input end of the inverter T is inputted with low voltage level, the eighteen P type thin film transistor T18 is activated, and the output end outputs high voltage level of the constant high voltage level signal VGH.

Preferably, the respective thin film transistors are all LTPS semiconductor thin film transistors.

Figure 7:
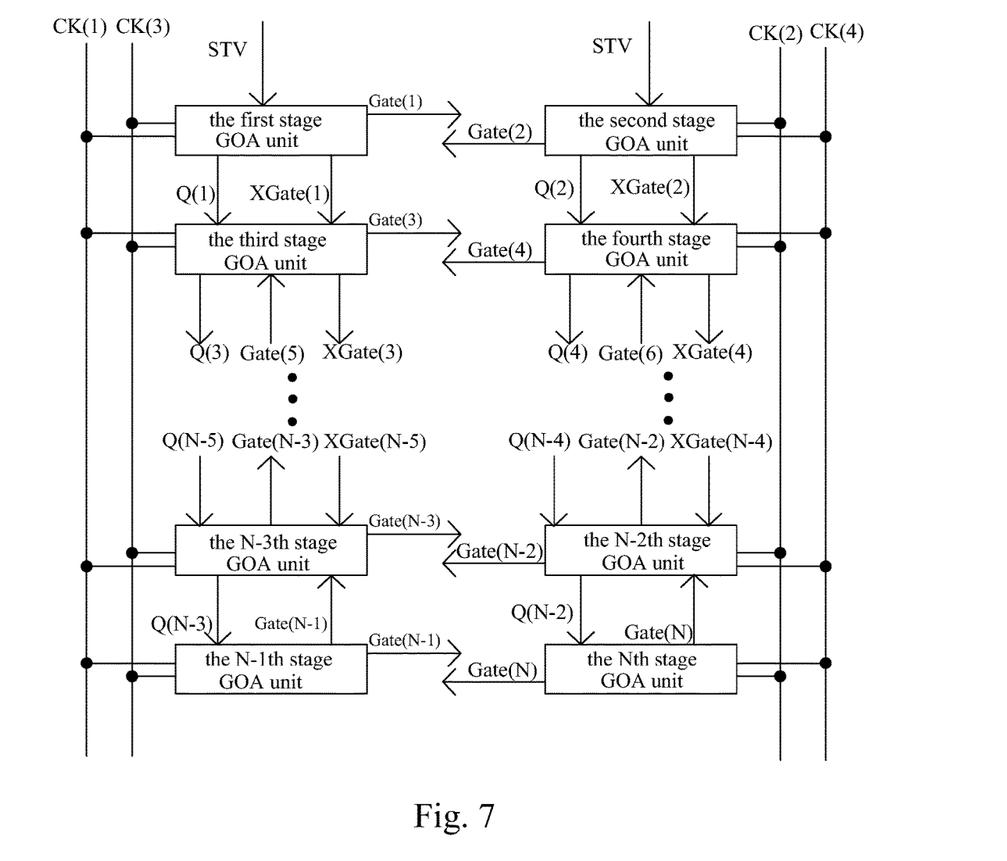
FIG. 7 is a diagram of the drive structure of the first embodiment in the CMOS GOA circuit of reducing clock signal loading according to the present invention.

With combination of FIG. 2 and FIG. 7, in the first embodiment of the present invention, the clock signal comprises four clock signals: a first, a second, a third and a fourth clock signals CK(1), CK(2), CK(3), CK(4); as the Mth clock signal CK(M) is the third clock signal CK(3), the M+2th clock signal CK(M+2) is the first clock signal CK(1); as the Mth clock signal CK(M) is the fourth clock signal CK(4), the M+2th clock signal CK(M+2) is the second clock signal CK(2). The GOA units of odd stages which are cascade coupled receive the first clock signal CK(1) and the third clock signal CK(3), and the GOA units of even stages which are cascade coupled receive the second clock signal CK(2) and the fourth clock signal CK(4). The GOA units of the first, the second, the next to last and the last stages can utilize the present GOA unit circuit shown in FIG. 1, and the GOA units of the first, the second stages receive the start signal STV of the circuit to drive the CMOS GOA circuit to start working. Except the GOA units of the first, the second, the next to last and the last stages, all the rest GOA units receive the stage transfer signal Q(N−2) of the two former N−2th stage GOA unit, the inverted scan drive signal XGate(N−2) of the two former N−2th stage GOA unit and the scan drive signal Gate(N+2) of the two former N+2th stage GOA unit.

Figure 6:
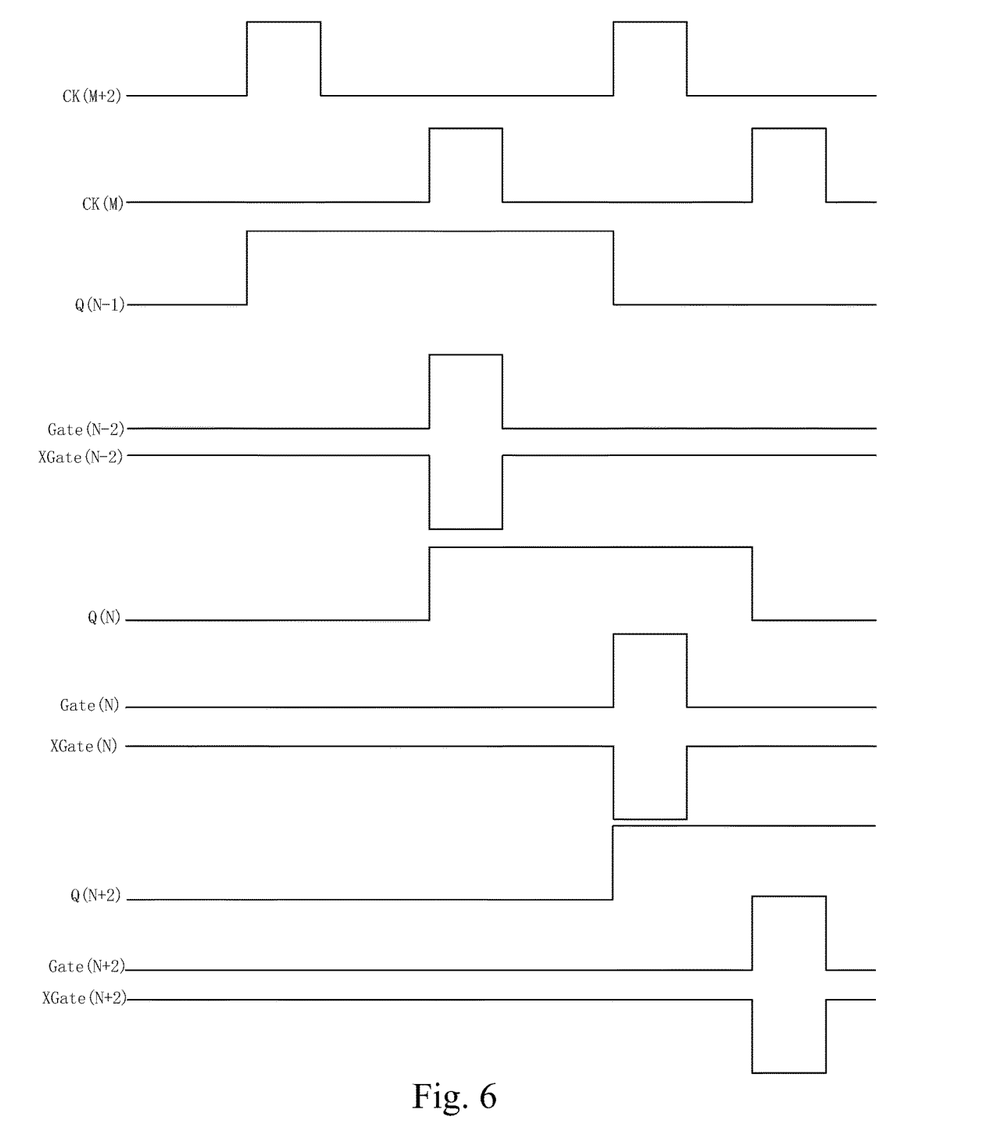
FIG. 6 is a sequence diagram of the CMOS GOA circuit of reducing clock signal loading according to the present invention.

With combination of FIG. 2 and FIG. 6, the specific working process of the first embodiment of the CMOS GOA circuit of reducing clock signal loading according to the present invention is:

As the high voltage level pulse of the stage transfer signal Q(N−2) of the two former N−2th stage GOA unit and the low voltage level pulse of the inverted scan drive signal XGate(N−2) arrive, the Mth clock signal CK(M) is high voltage level, and then, the second N type thin film transistor T2, the third N type thin film transistor T3 and the fourth N type thin film transistor T4 are activated, and the stage transfer signal Q(N) is charged to be high voltage level, and meanwhile, the eleventh N type thin film transistor T11 is controlled by the inverted scan drive signal XGate(N−2) of the two former N−2th stage GOA unit is deactivated to prevent that the constant low voltage level signal VGL received by the drain of the twelfth N type thin film transistor T12 is transmitted to the stage transfer signal Q(N). Thus, the input of the stage transfer signal Q(N) does not have any competition path. During this process, the Mth clock signal CK(M) only needs to control the two transistors T2 and T5. In comparison with the CMOS GOA circuit according to prior art, the amount of the thin film transistors driven by the clock signal has been reduced by half to reduce the loading of the clock signal and to lower the RC delay and the power consumption of the clock signal.

At the next moment, the Mth clock signal CK(M) is converted to be low voltage level, and the stage transfer signal Q(N) is latched at high voltage level by the lath module 2.

As the high voltage level pulse of the M+2th clock signal CK(M+2) arrives, the NAND gate NAND of the signal process module 4 outputs low voltage level, and through the output buffer module 5, the inverted scan drive signal XGate(N) outputs low voltage level, and the scan drive signal Gate(N) outputs high voltage level.

After the function of the high voltage level pulse of the M+2th clock signal CK(M+2) is finished, and the signal is converted to be low voltage level, the NAND gate NAND of the signal process module 4 outputs high voltage level, and through the output buffer module 5, the inverted scan drive signal XGate(N) keeps at high voltage level, and the scan drive signal Gate(N) keeps at high voltage level.

Then, as the Mth clock signal CK(M) is converted to be high voltage level, again, the stage transfer signal Q(N−2) of the two former N−2th stage is low voltage level, and the scan drive signal G(N+2) of the two latter N+2th stage is high voltage level, and then, the fifth N type thin film transistor T5 and the sixth N type thin film transistor T6 are activated, and the stage transfer signal Q(N) is pulled down to low voltage level, and meanwhile, the tenth P type thin film transistor T10 controlled by the scan drive signal G(N+2) of the two latter N+2th stage is deactivated to prevent that the constant high voltage level signal VGH of the ninth P type thin film transistor P9 is transmitted to the stage transfer signal Q(N). Thus, the pull down of the stage transfer signal Q(N) does not have any competition path.

When the function of the high voltage level of the Mth clock signal CK(M) is finished, the stage transfer signal Q(N) keeps at low voltage level.

Figure 3:
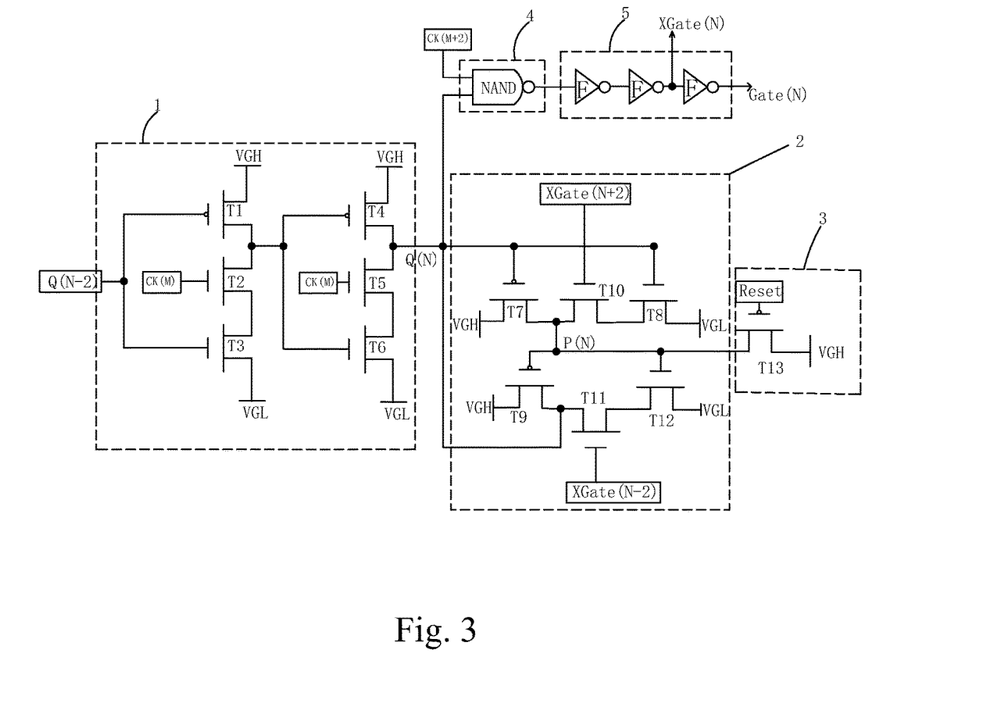
FIG. 3 is a circuit diagram of the second embodiment according to the CMOS GOA circuit of reducing clock signal loading of the present invention.

Please refer to FIG. 3. The second embodiment and the first embodiment of the CMOS GOA circuit of reducing clock signal loading according to the present invention only have difference in the specific circuit structure of the latch module 2, the other modules are the same. As shown in FIG. 3, in the second embodiment, the latch module 2 latches the stage transfer signal Q(N), and receives an inverted scan drive signal XGate(N−2) of the two former N−2th stage GOA unit to be an input control signal of the stage transfer signal Q(N) to solve the competition problem occurs as the stage transfer signal Q(N) is inputted, and then, the inverted scan drive signal XGate(N+2) of the two latter N+2th stage GOA unit is received to be the pull down control signal of the stage transfer signal Q(N) to solve the competition problem occurs in the pull down procedure of the stage transfer signal Q(N).

The specific structure of the latch module 2 comprises: a seventh P type thin film transistor T7, an eighth N type thin film transistor T8, a ninth P type thin film transistor T9, a tenth P type thin film transistor T10, an eleventh N type thin film transistor T11 and a twelfth N type thin film transistor T12; a gate of the seventh P type thin film transistor T7 receives the stage transfer signal Q(N), and a source receives the constant high voltage level signal VGH, and a drain is electrically coupled to a source of the tenth N type thin film transistor T10 and the node P(N); a gate of the tenth N type thin film transistor T10 receives the inverted scan drive signal XGate(N+2) of the two latter N+2th stage GOA unit, and a drain is electrically coupled to a source of the eighth N type thin film transistor T8; a gate of the eighth N type thin film transistor T8 receives the stage transfer signal Q(N), and a drain receives the constant low voltage level signal VGL; a gate of the ninth P type thin film transistor T9 is electrically coupled to the node P(N), and a source receives the constant high voltage level signal VGH, and a drain is electrically coupled to a source of the eleventh N type thin film transistor T11 and the stage transfer signal Q(N); a gate of the eleventh N type thin film transistor T11 receives the inverted scan drive signal XGate(N−2) of the two former N−2th stage GOA unit, and a drain is electrically coupled to a source of the twelfth N type thin film transistor T12; a gate of the twelfth N type thin film transistor T12 is electrically coupled to the node P(N), and a drain receives the constant low voltage level signal VGL.

With combination of FIG. 3 and FIG. 6, the specific working process of the second embodiment of the CMOS GOA circuit of reducing clock signal loading according to the present invention is:

As the high voltage level pulse of the stage transfer signal Q(N−2) of the two former N−2th stage GOA unit and the low voltage level pulse of the inverted scan drive signal XGate(N−2) arrive, the Mth clock signal CK(M) is high voltage level, and then, the second N type thin film transistor T2, the third N type thin film transistor T3 and the fourth N type thin film transistor T4 are activated, and the stage transfer signal Q(N) is charged to be high voltage level, and meanwhile, the eleventh N type thin film transistor T11 is controlled by the inverted scan drive signal XGate(N−2) of the two former N−2th stage GOA unit is deactivated to prevent that the constant low voltage level signal VGL received by the drain of the twelfth N type thin film transistor T12 is transmitted to the stage transfer signal Q(N). Thus, the input of the stage transfer signal Q(N) does not have any competition path. During this process, the Mth clock signal CK(M) only needs to control the two transistors T2 and T5. In comparison with the CMOS GOA circuit according to prior art, the amount of the thin film transistors driven by the clock signal has been reduced by half to reduce the loading of the clock signal and to lower the RC delay and the power consumption of the clock signal.

At the next moment, the Mth clock signal CK(M) is converted to be low voltage level, and the stage transfer signal Q(N) is latched at high voltage level by the lath module 2.

As the high voltage level pulse of the M+2th clock signal CK(M+2) arrives, the NAND gate NAND of the signal process module 4 outputs low voltage level, and through the output buffer module 5, the inverted scan drive signal XGate(N) outputs low voltage level, and the scan drive signal Gate(N) outputs high voltage level.

After the function of the high voltage level pulse of the M+2th clock signal CK(M+2) is finished, and the signal is converted to be low voltage level, the NAND gate NAND of the signal process module 4 outputs high voltage level, and through the output buffer module 5, the inverted scan drive signal XGate(N) keeps at high voltage level, and the scan drive signal Gate(N) keeps at high voltage level.

Then, as the Mth clock signal CK(M) is converted to be high voltage level, again, the stage transfer signal Q(N−2) of the two former N−2th stage is low voltage level, and the scan drive signal G(N+2) of the two latter N+2th stage is low voltage level, and then, the fifth N type thin film transistor T5 and the sixth N type thin film transistor T6 are activated, and the stage transfer signal Q(N) is pulled down to low voltage level, and meanwhile, the tenth P type thin film transistor T10 controlled by the inverted scan drive signal XG(N+2) of the two latter N+2th stage is deactivated, and the seventh P type thin film transistor P7 is activated by the control of the stage transfer signal Q(N), and the constant high voltage level signal VGH passes through the activated seventh P type thin film transistor P7 to make the node P(N) to be high voltage level, and the ninth P type thin film transistor P9 controlled by the node P(N) is deactivated to prevent that the constant high voltage level signal VGH received by the source of the ninth P type thin film transistor P9 is transmitted to the stage transfer signal Q(N). Thus, the pull down of the stage transfer signal Q(N) does not have any competition path.

When the function of the high voltage level of the Mth clock signal CK(M) is finished, the stage transfer signal Q(N) keeps at low voltage level.

Figure 8:
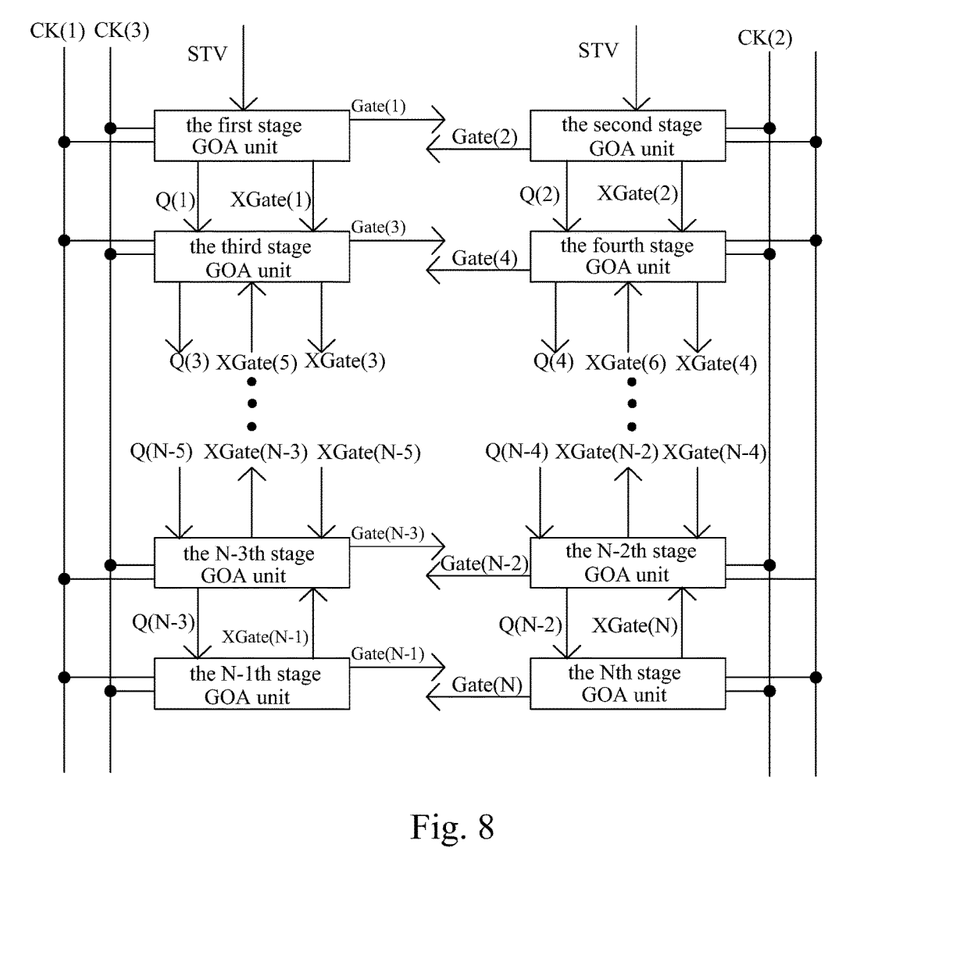
FIG. 8 is a diagram of the drive structure of the second embodiment in the CMOS GOA circuit of reducing clock signal loading according to the present invention.

With combination of FIG. 3 and FIG. 8, in the second embodiment of the present invention, the clock signal comprises four clock signals: a first, a second, a third and a fourth clock signals CK(1), CK(2), CK(3), CK(4); as the Mth clock signal CK(M) is the third clock signal CK(3), the M+2th clock signal CK(M+2) is the first clock signal CK(1); as the Mth clock signal CK(M) is the fourth clock signal CK(4), the M+2th clock signal CK(M+2) is the second clock signal CK(2). The GOA units of odd stages which are cascade coupled receive the first clock signal CK(1) and the third clock signal CK(3), and the GOA units of even stages which are cascade coupled receive the second clock signal CK(2) and the fourth clock signal CK(4). The GOA units of the first, the second, the next to last and the last stages can utilize the present GOA unit circuit shown in FIG. 1, and the GOA units of the first, the second stages receive the start signal STV of the circuit to drive the CMOS GOA circuit to start working. Except the GOA units of the first, the second, the next to last and the last stages, all the rest GOA units receive the stage transfer signal Q(N−2) of the two former N−2th stage GOA unit, the inverted scan drive signal XGate(N−2) of the two former N−2th stage GOA unit and the inverted scan drive signal XGate(N+2) of the two former N+2th stage GOA unit.

In conclusion, the CMOS GOA circuit of reducing clock signal loading according to the present invention comprises the input control module, the latch module, the reset module, the signal process module and the output buffer module; in the input control module, the clock signal merely needs to control the second N type thin film transistor and the fifth N type thin film transistor. In comparison with the CMOS GOA circuit according to prior art, the amount of the thin film transistors driven by the clock signal can be decreased to reduce the clock signal loading, and to lower the RC delay and the power consumption of the clock signal; the latch module utilizes the inverted scan drive signal of the two former N−2th stage GOA unit to be the input control signal of the stage transfer signal to solve the competition problem occurs as the stage transfer signal is inputted, and utilizes the scan drive signal of the two latter N+2th stage GOA unit or the inverted scan drive signal of the two latter N+2th stage GOA unit to be the pull down control signal of the stage transfer signal to solve the competition problem occurs in the pull down procedure of the stage transfer signal.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A CMOS GOA circuit of reducing clock signal loading, comprising: GOA units of a plurality of stages, wherein the GOA units of odd stages are cascade coupled, and the GOA units of even stages are cascade coupled;
  N is set to be positive integer, and except the GOA units of the first, the second, the next to last and the last stages, in the Nth GOA unit comprises: an input control module, a latch module electrically coupled to the input control module, a reset module electrically coupled to the latch module, a signal process module electrically coupled to the latch module, an output buffer module electrically coupled to the signal process module;
  the input control module receives a stage transfer signal and a Mth clock signal of the two former N−2th stage GOA unit, and is employed to invert the stage transfer signal of the two former N−2th stage GOA unit twice to obtain a stage transfer signal and input the stage transfer signal to the latch module;
  the latch module receives an inverted scan drive signal of the two former N−2th stage GOA unit to be an input control signal of the stage transfer signal, and is employed to latch the stage transfer signal; meanwhile, the latch module further receives a scan drive signal of the two latter N+2th stage GOA unit or an inverted scan drive signal of the two latter N+2th stage GOA unit to be a pull down control signal of the stage transfer signal;
  the reset module is employed to perform clear zero process to the stage transfer signal;
  the signal process module is employed to implement NAND logic process to the M+2th clock signal and the stage transfer signal to generate a scan drive signal of the Nth stage GOA unit;
  the output buffer module is employed to output the scan driving signal and to increase a driving ability of the scan driving signal.

2. The CMOS GOA circuit of reducing clock signal loading according to claim 1, wherein the input control module comprises: a first P type thin film transistor, a second N type thin film transistor and a third N type thin film transistor, which are coupled in series, and a fourth P type thin film transistor, a fifth N type thin film transistor and a sixth N type thin film transistor, which are coupled in series; a gate of the first P type thin film transistor receives the stage transfer signal of the two former N−2th stage GOA unit, and a source receives the constant high voltage level signal, and a drain is electrically coupled to a source of the second N type thin film transistor; a gate of the second N type thin film transistor receives the Mth clock signal, and a drain is electrically coupled to a source of the third N type thin film transistor; a gate of the third N type thin film transistor receives the stage transfer signal of the two former N−2th stage GOA unit, and a drain receives the constant low voltage level signal; a gate of the fourth P type thin film transistor is electrically coupled to the drain of the first P type thin film transistor and the source of the second N type thin film transistor, and a source receives the constant high voltage level signal, and a drain is electrically coupled to a source of the fifth N type thin film transistor; a gate of the fifth N type thin film transistor receives the Mth clock signal, and a drain is electrically coupled to a source of the sixth N type thin film transistor; a gate of the sixth N type thin film transistor is electrically coupled to the drain of the drain of the first P type thin film transistor and the source of the second N type thin film transistor, and a drain receives the constant low voltage level signal; a drain of the P type fourth thin film transistor and a source of the fifth N type thin film transistor output the stage transfer signal.

3. The CMOS GOA circuit of reducing clock signal loading according to claim 1, wherein as the latch module receives the scan drive signal of the two latter N+2th stage GOA unit to be the pull down control signal of the stage transfer signal, the latch module comprises: a seventh P type thin film transistor, an eighth N type thin film transistor, a ninth P type thin film transistor, a tenth P type thin film transistor, an eleventh N type thin film transistor and a twelfth N type thin film transistor; a gate of the seventh P type thin film transistor receives the stage transfer signal, and a source receives the constant high voltage level signal, and a drain is electrically coupled to a source of the eighth N type thin film transistor and the node; a gate of the eighth N type thin film transistor receives the stage transfer signal, and a drain receives the constant low voltage level signal; a gate of the ninth P type thin film transistor is electrically coupled to the node, and a source receives the constant high voltage level signal, and a drain is electrically coupled to a source of the tenth P type thin film transistor; a gate of the tenth P type thin film transistor receives the scan drive signal of the two latter N+2th stage GOA unit, and a drain is electrically coupled to a source of the eleventh N type thin film transistor and the stage transfer signal; a gate of the eleventh N type thin film transistor receives the inverted scan drive signal of the two former N−2th stage GOA unit, and a drain is electrically coupled to a source of the twelfth N type thin film transistor; a gate of the twelfth N type thin film transistor is electrically coupled to the node, and a drain receives the constant low voltage level signal.

4. The CMOS GOA circuit of reducing clock signal loading according to claim 1, wherein as the latch module receives the scan drive signal of the two latter N+2th stage GOA unit to be the pull down control signal of the stage transfer signal, the latch module comprises: a seventh P type thin film transistor, an eighth N type thin film transistor, a ninth P type thin film transistor, a tenth P type thin film transistor, an eleventh N type thin film transistor and a twelfth N type thin film transistor; a gate of the seventh P type thin film transistor receives the stage transfer signal, and a source receives the constant high voltage level signal, and a drain is electrically coupled to a source of the tenth N type thin film transistor and the node; a gate of the tenth N type thin film transistor receives the inverted scan drive signal of the two latter N+2th stage GOA unit, and a drain is electrically coupled to a source of the eighth N type thin film transistor; a gate of the eighth N type thin film transistor receives the stage transfer signal, and a drain receives the constant low voltage level signal; a gate of the ninth P type thin film transistor is electrically coupled to the node, and a source receives the constant high voltage level signal, and a drain is electrically coupled to a source of the eleventh N type thin film transistor and the stage transfer signal; a gate of the eleventh N type thin film transistor receives the inverted scan drive signal of the two former N−2th stage GOA unit, and a drain is electrically coupled to a source of the twelfth N type thin film transistor; a gate of the twelfth N type thin film transistor is electrically coupled to the node, and a drain receives the constant low voltage level signal.

5. The CMOS GOA circuit of reducing clock signal loading according to claim 1, wherein the reset module comprises a thirteenth thin film transistor, and a gate of the thirteenth thin film transistor receives a reset signal, and a source receives the constant high voltage level signal, and a drain is electrically coupled to the latch module through the node.

6. The CMOS GOA circuit of reducing clock signal loading according to claim 1, wherein the signal process module comprises a NAND gate, and a first input end of the NAND gate receives the stage transfer signal, and a second input end receives the M+2 clock signal, and an output end is electrically coupled to the output buffer module.

7. The CMOS GOA circuit of reducing clock signal loading according to claim 6, wherein the output buffer module comprises three inverters which are sequentially coupled in series, and an input end of the first inverter, which is closest to the signal process module, is electrically coupled to the output end of the NAND gate, and an output end of the third inverter, which is farthest to the signal process module, outputs the scan drive signal, and an output end of the second inverter outputs the Nth inverted scan drive signal.

8. The CMOS GOA circuit of reducing clock signal loading according to claim 1, wherein the clock signal comprises four clock signals: a first clock signal, a second clock signal, a third clock signal and a fourth clock signal; as the Mth clock signal is the third clock signal, the M+2th clock signal is the first clock signal; as the Mth clock signal is the fourth clock signal, the M+2th clock signal is the second clock signal;

the GOA units of odd stages which are cascade coupled receive the first clock signal and the third clock signal, and the GOA units of even stages which are cascade coupled receive the second clock signal and the fourth clock signal.

9. The CMOS GOA circuit of reducing clock signal loading according to claim 6, wherein the NAND gate comprises a fourteenth P type thin film transistor and a fifteenth P type thin film transistor, which are oppositely located, and a sixteenth N type thin film transistor and a seventeenth N type thin film transistor, which are coupled in series; a gate of the fourteenth P type thin film transistor and a gate of the sixteenth N type thin film transistor are electrically coupled to be the first input end of the NAND gate, and a gate of the fifteenth P type thin film transistor and a gate of the seventeenth N type thin film transistor are electrically coupled to be the second input end of the NAND gate, and both the drains of the fourteenth P type thin film transistor and the fifteenth P type thin film transistor are electrically coupled to a source of the sixteenth N type thin film transistor to be the output end of the NAND gate, and a drain of the sixteenth N type thin film transistor is electrically coupled to a source of the seventeenth N type thin film transistor, and a drain of the seventeenth N type thin film transistor receives the constant low voltage level signal.

10. The CMOS GOA circuit of reducing clock signal loading according to claim 7, wherein each inverter comprises an eighteen P type thin film transistor and a nineteenth N type thin film transistor; gates of the eighteen P type thin film transistor and the nineteenth N type thin film transistor are electrically coupled to each other to construct the input end of the inverter, and a source of the eighteen P type thin film transistor receives the constant high voltage level signal, and a drain of the nineteenth N type thin film transistor receives the constant low voltage level signal, and a drain of the eighteen P type thin film transistor and a source of the nineteenth N type thin film transistor are electrically coupled to each other to construct the output end of the inverter; the output end of the former inverter is electrically coupled to the input end of the latter inverter.

11. A CMOS GOA circuit of reducing clock signal loading, comprising: GOA units of a plurality of stages, wherein the GOA units of odd stages are cascade coupled, and the GOA units of even stages are cascade coupled;
   N is set to be positive integer, and except the GOA units of the first, the second, the next to last and the last stages, in the Nth GOA unit comprises: an input control module, a latch module electrically coupled to the input control module, a reset module electrically coupled to the latch module, a signal process module electrically coupled to the latch module, an output buffer module electrically coupled to the signal process module;
   the input control module receives a stage transfer signal and a Mth clock signal of the two former N−2th stage GOA unit, and is employed to invert the stage transfer signal of the two former N−2th stage GOA unit twice to obtain a stage transfer signal and input the stage transfer signal to the latch module;
   the latch module receives an inverted scan drive signal of the two former N−2th stage GOA unit to be an input control signal of the stage transfer signal, and is employed to latch the stage transfer signal; meanwhile, the latch module further receives a scan drive signal of the two latter N+2th stage GOA unit or an inverted scan drive signal of the two latter N+2th stage GOA unit to be a pull down control signal of the stage transfer signal;
   the reset module is employed to perform clear zero process to the stage transfer signal;
   the signal process module is employed to implement NAND logic process to the M+2th clock signal and the stage transfer signal to generate a scan drive signal of the Nth stage GOA unit;
   the output buffer module is employed to output the scan driving signal and to increase a driving ability of the scan driving signal;
   wherein the input control module comprises: a first P type thin film transistor, a second N type thin film transistor and a third N type thin film transistor, which are coupled in series, and a fourth P type thin film transistor, a fifth N type thin film transistor and a sixth N type thin film transistor, which are coupled in series; a gate of the first P type thin film transistor receives the stage transfer signal of the two former N−2th stage GOA unit, and a source receives the constant high voltage level signal, and a drain is electrically coupled to a source of the second N type thin film transistor; a gate of the second N type thin film transistor receives the Mth clock signal, and a drain is electrically coupled to a source of the third N type thin film transistor; a gate of the third N type thin film transistor receives the stage transfer signal of the two former N−2th stage GOA unit, and a drain receives the constant low voltage level signal; a gate of the fourth P type thin film transistor is electrically coupled to the drain of the first P type thin film transistor and the source of the second N type thin film transistor, and a source receives the constant high voltage level signal, and a drain is electrically coupled to a source of the fifth N type thin film transistor; a gate of the fifth N type thin film transistor receives the Mth clock signal, and a drain is electrically coupled to a source of the sixth N type thin film transistor; a gate of the sixth N type thin film transistor is electrically coupled to the drain of the drain of the first P type thin film transistor and the source of the second N type thin film transistor, and a drain receives the constant low voltage level signal; a drain of the P type fourth thin film transistor and a source of the fifth N type thin film transistor output the stage transfer signal;
   wherein the reset module comprises a thirteenth thin film transistor, and a gate of the thirteenth thin film transistor receives a reset signal, and a source receives the constant high voltage level signal, and a drain is electrically coupled to the latch module through the node.

12. The CMOS GOA circuit of reducing clock signal loading according to claim 11, wherein as the latch module receives the scan drive signal of the two latter N+2th stage GOA unit to be the pull down control signal of the stage transfer signal, the latch module comprises: a seventh P type thin film transistor, an eighth N type thin film transistor, a ninth P type thin film transistor, a tenth P type thin film transistor, an eleventh N type thin film transistor and a twelfth N type thin film transistor; a gate of the seventh P type thin film transistor receives the stage transfer signal, and a source receives the constant high voltage level signal, and a drain is electrically coupled to a source of the eighth N type thin film transistor and the node; a gate of the eighth N type thin film transistor receives the stage transfer signal, and a drain receives the constant low voltage level signal; a gate of the ninth P type thin film transistor is electrically coupled to the node, and a source receives the constant high voltage level signal, and a drain is electrically coupled to a source of the tenth P type thin film transistor; a gate of the tenth P type thin film transistor receives the scan drive signal of the two latter N+2th stage GOA unit, and a drain is electrically coupled to a source of the eleventh N type thin film transistor and the stage transfer signal; a gate of the eleventh N type thin film transistor receives the inverted scan drive signal of the two former N−2th stage GOA unit, and a drain is electrically coupled to a source of the twelfth N type thin film transistor; a gate of the twelfth N type thin film transistor is electrically coupled to the node, and a drain receives the constant low voltage level signal.

13. The CMOS GOA circuit of reducing clock signal loading according to claim 11, wherein as the latch module receives the scan drive signal of the two latter N+2th stage GOA unit to be the pull down control signal of the stage transfer signal, the latch module comprises: a seventh P type thin film transistor, an eighth N type thin film transistor, a ninth P type thin film transistor, a tenth P type thin film transistor, an eleventh N type thin film transistor and a twelfth N type thin film transistor; a gate of the seventh P type thin film transistor receives the stage transfer signal, and a source receives the constant high voltage level signal, and a drain is electrically coupled to a source of the tenth N type thin film transistor and the node; a gate of the tenth N type thin film transistor receives the inverted scan drive signal of the two latter N+2th stage GOA unit, and a drain is electrically coupled to a source of the eighth N type thin film transistor; a gate of the eighth N type thin film transistor receives the stage transfer signal, and a drain receives the constant low voltage level signal; a gate of the ninth P type thin film transistor is electrically coupled to the node, and a source receives the constant high voltage level signal, and a drain is electrically coupled to a source of the eleventh N type thin film transistor and the stage transfer signal; a gate of the eleventh N type thin film transistor receives the inverted scan drive signal of the two former N−2th stage GOA unit, and a drain is electrically coupled to a source of the twelfth N type thin film transistor; a gate of the twelfth N type thin film transistor is electrically coupled to the node, and a drain receives the constant low voltage level signal.

14. The CMOS GOA circuit of reducing clock signal loading according to claim 11, wherein the signal process module comprises a NAND gate, and a first input end of the NAND gate receives the stage transfer signal, and a second input end receives the M+2 clock signal, and an output end is electrically coupled to the output buffer module.

15. The CMOS GOA circuit of reducing clock signal loading according to claim 14, wherein the output buffer module comprises three inverters which are sequentially coupled in series, and an input end of the first inverter, which is closest to the signal process module, is electrically coupled to the output end of the NAND gate, and an output end of the third inverter, which is farthest to the signal process module, outputs the scan drive signal, and an output end of the second inverter outputs the Nth inverted scan drive signal.

16. The CMOS GOA circuit of reducing clock signal loading according to claim 11, wherein the clock signal comprises four clock signals: a first clock signal, a second clock signal, a third clock signal and a fourth clock signal; as the Mth clock signal is the third clock signal, the M+2th clock signal is the first clock signal; as the Mth clock signal is the fourth clock signal, the M+2th clock signal is the second clock signal;

the GOA units of odd stages which are cascade coupled receive the first clock signal and the third clock signal, and the GOA units of even stages which are cascade coupled receive the second clock signal and the fourth clock signal.

17. The CMOS GOA circuit of reducing clock signal loading according to claim 14, wherein the NAND gate comprises a fourteenth P type thin film transistor and a fifteenth P type thin film transistor, which are oppositely located, and a sixteenth N type thin film transistor and a seventeenth N type thin film transistor, which are coupled in series; a gate of the fourteenth P type thin film transistor and a gate of the sixteenth N type thin film transistor are electrically coupled to be the first input end of the NAND gate, and a gate of the fifteenth P type thin film transistor and a gate of the seventeenth N type thin film transistor are electrically coupled to be the second input end of the NAND gate, and both the drains of the fourteenth P type thin film transistor and the fifteenth P type thin film transistor are electrically coupled to a source of the sixteenth N type thin film transistor to be the output end of the NAND gate, and a drain of the sixteenth N type thin film transistor is electrically coupled to a source of the seventeenth N type thin film transistor, and a drain of the seventeenth N type thin film transistor receives the constant low voltage level signal.

18. The CMOS GOA circuit of reducing clock signal loading according to claim 15, wherein each inverter comprises an eighteen P type thin film transistor and a nineteenth N type thin film transistor; gates of the eighteen P type thin film transistor and the nineteenth N type thin film transistor are electrically coupled to each other to construct the input end of the inverter, and a source of the eighteen P type thin film transistor receives the constant high voltage level signal, and a drain of the nineteenth N type thin film transistor receives the constant low voltage level signal, and a drain of the eighteen P type thin film transistor and a source of the nineteenth N type thin film transistor are electrically coupled to each other to construct the output end of the inverter; the output end of the former inverter is electrically coupled to the input end of the latter inverter.

* * * * *